(12) United States Patent
Bae et al.

(10) Patent No.: US 7,115,459 B2
(45) Date of Patent: Oct. 3, 2006

(54) METHOD OF FABRICATING SIGE BI-CMOS DEVICE

(75) Inventors: Hyun Cheol Bae, Daejeon (KR); Seung Yun Lee, Daejeon (KR); Sang Hun Kim, Daejeon (KR); Jin Yeong Kang, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 11/283,012

(22) Filed: Nov. 18, 2005

(65) Prior Publication Data

US 2006/0121667 A1     Jun. 8, 2006

(30) Foreign Application Priority Data

Dec. 3, 2004     (KR) ............... 10-2004-0100826

(51) Int. Cl.
*H01L 21/8238* (2006.01)
(52) U.S. Cl. ............... 438/202; 438/217; 438/222; 438/234
(58) Field of Classification Search ........ 438/199–236, 438/309–377
See application file for complete search history.

(56) References Cited

U.S. PATENT DOCUMENTS

| 5,523,606 | A | 6/1996 | Yamazaki |
| 6,169,007 | B1 | 1/2001 | Pinter |
| 2005/0037588 | A1* | 2/2005 | Pinto et al. ............... 438/309 |

FOREIGN PATENT DOCUMENTS

| KR | 1998-064721 | 10/1998 |
| KR | 10-20040004639 | 1/2004 |
| KR | 10-0486304 | 4/2005 |

OTHER PUBLICATIONS

"75-GHz $f_T$ SiGe-Base Heterojunction Bipolar Transistors," Gary L. Patton et al, IEEE Electron Device Letters, vol. 11, No. 4, Apr. 1990, pp. 171-173.
"Current Status and Future Trends of SiGe BiCMOS Technology," David L. Harame et al, IEEE Transactions of Electron Devices, vol. 48, No. 11, Nov. 2001, pp. 2575-2594, © 2001 IEEE.
"Integration of SiGe Heterojunction Bipolar Transistors in a 200mm Industrial BiCMOS Technology," E. de Berranger et al, Thin Solid Films 294 (1997), pp. 250-253.
"SiGe HBT for Application in BiCMOS Technology: II. Design, Technology and Performance," S.C. Jain et al, Semiconductor Science and Technology 16 (2001), pp. R67-R85.
"Thermal Reaction of Nickel and $Si_{0.75}Ge_{0.25}$ Alloy," K.L. Pey et al, Journal of Vacuum Science & Technology A, vol. 20, No. 6, Nov./Dec. 2002, pp. 1903-1910.
"Very Low Cost Graded SiGe Base Bipolar Transistors for a High Performance Modular BiCMOS Process," C.A. King et al, International Electron Devices Meeting 1999, pp. 565-568, © 1999 IEEE.

* cited by examiner

*Primary Examiner*—H. Jey Tsai
(74) *Attorney, Agent, or Firm*—Ladas & Parry LLP (57) ABSTRACT

Provided is a method of fabricating a silicon germanium (SiGe) Bi-CMOS device. In the fabrication method, the source and drain of the CMOS device is formed using a silicon germanium (SiGe) heterojunction, instead of silicon, thereby preventing a leakage current resulting from a parasitic bipolar operation. Further, since the source and drain is connected with an external interconnection through the nickel (Ni) silicide layer, the contact resistance is reduced, thereby preventing loss of a necessary voltage for a device operation and accordingly, making it possible to enable a low voltage and low power operation and securing a broad operation region even in a low voltage operation of an analogue circuit.

10 Claims, 8 Drawing Sheets

METHOD OF FABRICATING SIGE BI-CMOS DEVICE

CROSS-REFERENCE TO RELATED APPLICATION

This application claims priority to and the benefit of Korean Patent Application No. 2004-100826, filed Dec. 3, 2004, the disclosure of which is incorporated herein by reference in its entirety.

BACKGROUND

1. Field of the Invention

The present invention relates to a method of fabricating a semiconductor device, and more particularly, to a method of fabricating a silicon germanium (SiGe) Bi-CMOS device having a CMOS transistor and a SiGe heterojunction bipolar transistor (HBT) using an epitaxial layer containing germanium (Ge) as a base.

2. Discussion of Related Art

SiGe Bi-CMOS technology has been recognized as the most suitable technology for fabricating a System on Chip (SoC) of radio frequency (RF)/analogue/digital among various wireless mobile communication components. In a modern wireless mobile communication field having a mainstream of miniaturization and multifunction, the SiGe Bi-CMOS technology is widely used in fabricating a System on Chip (SoC) for information communication equipment such as a cellular phone, owing to the fact that a SiGe HBT suitable to an RF/analogue circuit and a CMOS device suitable to a digital circuit can be integrated on one chip.

The SiGe HBT has advantages in that a silicon germanium (SiGe) alloy material containing about 20% germanium (Ge) mixed with silicon (Si) can be used, instead of silicon (Si), as a base, thereby obtaining a large current gain in comparison to a conventional device, and the base can be thinned, thereby making it possible to enable a high speed and radio frequency operation and achieving low power of the CMOS device.

In recent years, nano scale CMOS fabrication technology is being developed to realize an ultra-low power device. However, in the case where a device has a linewidth less than 100 nm and is fabricated using a conventional method, the resistance abruptly increases, thereby making it difficult to realize a nano-scale ultra-high speed and ultra-low power device.

SUMMARY OF THE INVENTION

The present invention is directed to implementation of a method of fabricating a silicon germanium (SiGe) Bi-CMOS device, in which a silicide process using nickel (Ni) is employed, thereby improving a radio frequency (RF) characteristic of a heterojunction bipolar transistor (HBT), and preventing an abrupt increase of contact resistance due to a reduction in linewidth of a CMOS device.

One aspect of the present invention is to provide a method of fabricating a silicon germanium (SiGe) Bi-CMOS device having a heterojunction bipolar transistor and a CMOS (Complementary Metal Oxide Semiconductor) transistor, the method including the steps of: forming a sub-collector region in a substrate of a bipolar transistor region, and forming well regions in the substrate of a CMOS transistor region, respectively; growing silicon epitaxial layers on the substrate of the sub-collector region and the well regions; forming a collector and a collector plug in the silicon epitaxial layers of the bipolar transistor region, respectively, and implanting ions for controlling a threshold voltage into the silicon epitaxial layers of the CMOS transistor region; forming a gate oxide layer on the substrate of the CMOS transistor region, and forming a first epitaxial layer on the collector and the gate oxide layer; forming an emitter on the first epitaxial layer of the collector, and forming a gate on the gate oxide layer; implanting impurity ions into the first epitaxial layer at both sides of the gate to form a LDD (Lightly Doped Drain) region, and implanting impurity ions into the collector at both sides of the emitter to form an external base layer; forming spacers at both sidewalls of the emitter and the gate, respectively, and forming a second epitaxial layer on the first epitaxial layer, the emitter, the collector plug, the gate, and the LDD region; forming a source and a drain in the second epitaxial layer at both sides of the gate; and depositing and heat treating a nickel (Ni) layer on an entire surface of the resultant structure to form a nickel silicide layer on the second epitaxial layer, the emitter, the collector plug, the gate, and the source and drain, and removing the nickel (Ni) layer remaining without reaction.

It is characterized in that the first epitaxial layer is formed of a buffer layer, a SiGe layer, and a cap layer, and the buffer layer and the cap layer is formed of an undoped silicon layer.

It is characterized in that the second epitaxial layer is formed using selective epitaxial growth (SEG), and the second epitaxial layer is grown using gases such as $SiH_2Cl_2$, $GeH_4$, $HCl$, and $H_2$, at a predetermined pressure and at a temperature of 650 to 700° C., to have a thickness of 1000 to 3000 Å.

It is characterized in that the nickel (Ni) layer is deposited to a thickness of 500 to 1000 Å using a sputtering process, and the heat-treatment is performed at a temperature of 300 to 600° C.

It is characterized in that after the deposition of the nickel (Ni) layer, a cap layer is formed on the nickel (Ni) layer in order to prevent oxidation of the nickel (Ni) layer, and the cap layer is formed of TiN.

It is characterized in that the nickel (Ni) layer is removed by a wet etching process using a one-to-one solution of $H_2SO_4$ and $H_2O_2$, and in the step of removing the nickel (Ni) layer, the nickel (Ni) layer is not removed on the source and drain.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF PREFERRED EMBODIMENTS

Hereinafter, an exemplary embodiment of the present invention will be described in detail. However, the present invention is not limited to the embodiments disclosed below, but can be implemented in various types. Therefore, the present embodiment is provided for complete disclosure of the present invention and to fully inform the scope of the present invention to those ordinarily skilled in the art.

FIGS. 1 to 15 are cross-sectional views illustrating a method of fabricating a silicon germanium (SiGe) Bi-CMOS device according to an exemplary embodiment of the present invention.

Figure 1:
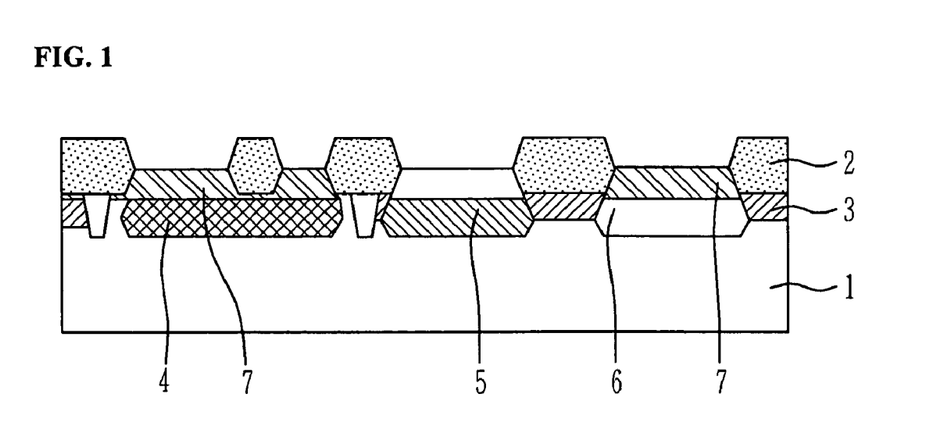
FIGS. 1 to 15 are cross-sectional views illustrating a method of fabricating a silicon germanium (SiGe) Bi-CMOS device according to an exemplary embodiment of the present invention.

Referring to FIG. 1, an isolation junction region 3 and an isolation layer 2 are formed on a semiconductor substrate 1 to define a silicon germanium (SiGe) heterojunction bipolar transistor (HBT) region, an NMOS transistor (NMOS) region, and a PMOS transistor (PMOS) region. An $N^+$ sub-collector region 4 is formed in the substrate 1 of the HBT region, a P-well region 5 is formed in the substrate 1 of the NMOS transistor region, and an N-well region 6 is formed in the substrate 1 of the PMOS transistor region. A silicon epitaxial layer 7 is grown in the substrate 1 of the $N^+$ sub-collector region 4, the P-type well region 5, and the N-type well region 6.

The isolation layer 2 is grown for four hours in a thermal oxidation furnace of 1000° C., using a nitride layer as a mask, to have a thickness of 6500 Å. The nitride layer is etched using a heated phosphoric acid.

Figure 2:
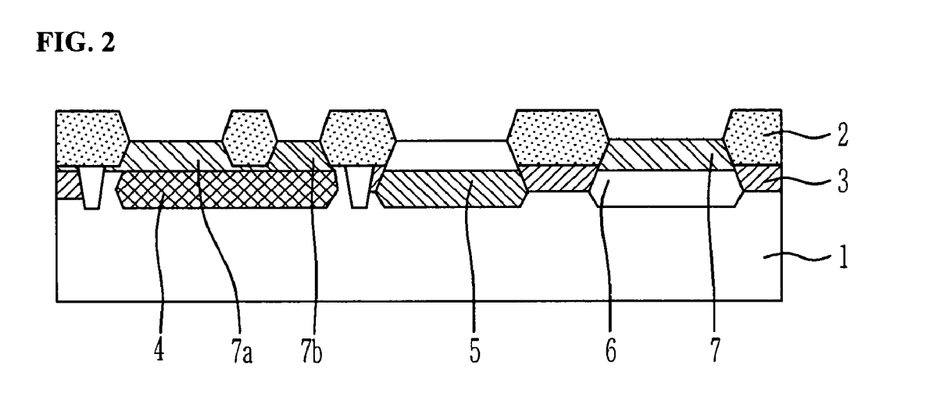

Referring to FIG. 2, the silicon epitaxial layer 7 of the HBT region is ion-implanted to form a collector 7a, and the silicon epitaxial layers 7 of the NMOS transistor (NMOS) and PMOS transistor (PMOS) regions are ion-implanted with ions for controlling a threshold voltage. A predetermined portion of the collector 7a is ion-implanted with high-concentration ions to form a collector plug 7b. The collector plug 7b is a region for connecting the collector 7a to the external, and is ion-implanted with high-concentration ions to have a small contact resistance.

The ion implantation for forming the collector 7a reduces a breakdown withstanding voltage to about three voltages, but can improve an operating speed. Therefore, the ion implantation is selectively executed only for an ultra high-speed digital or high-speed analog device. The collector 7a is ion-implanted with P-type ions having a concentration of about $2\times10^{13}/cm^2$ at an energy of 180 KeV, ion-implanted with $BF_2$ ions having a concentration of about $7.7\times10^{12}/cm^2$ at an energy of 80 KeV to control the threshold voltage of the NMOS transistor (NMOS), and ion-implanted with P-type ions having a concentration of about $5.5\times10^{11}/cm^2$ at an energy of 125 KeV to control the threshold voltage of PMOS transistor (PMOS). The collector plug 7b is ion-implanted with P-type ions having a concentration of $4\times10^{15}/cm^2$ at an energy of 80 KeV.

Figure 3:
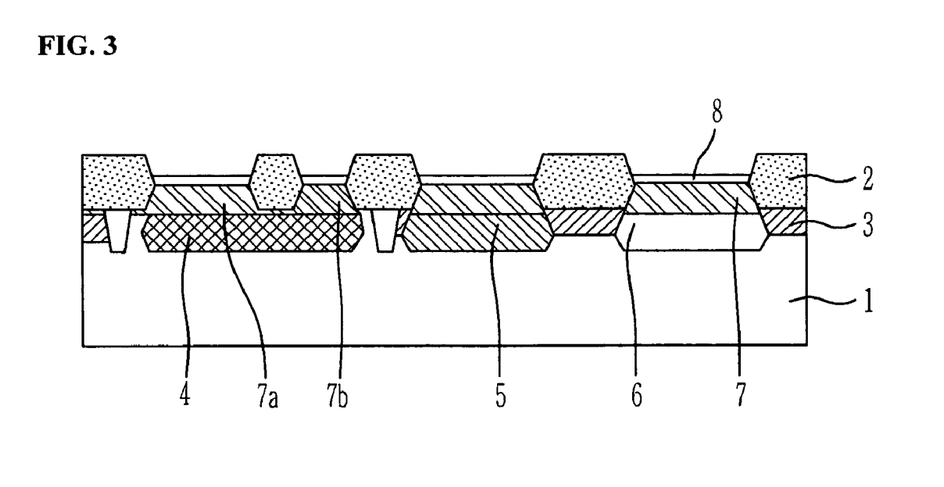

Referring to FIG. 3, the resultant structure is oxidized for about one hour in the thermal oxidation furnace of 850° C. to form a gate oxide layer 8 on its entire surface. The gate oxide layer 8 is controlled in thickness depending on a gate line width. When the gate line width is 0.5 μm, the gate oxide layer 8 is controlled to a thickness of about 150 Å, and in a nano sized device, the gate oxide layer 8 is controlled to a thickness of about 20 Å.

Figure 4:
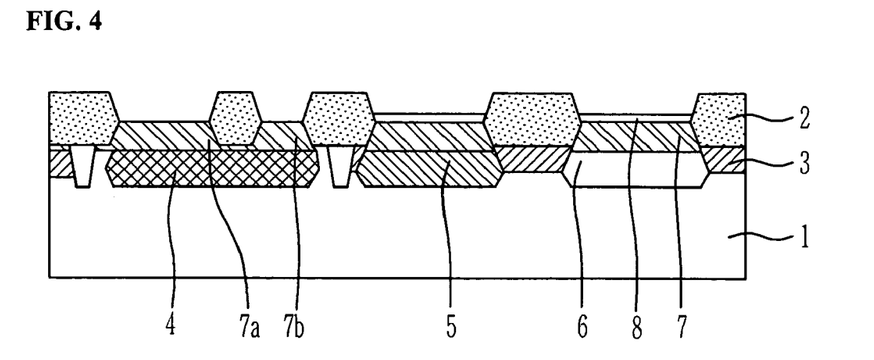

Referring to FIG. 4, the gate oxide layer 8 of the HBT region is etched using a wet etching process, so that the gate oxide layer 8 remains only on the substrate 1 of the NMOS transistor (NMOS) and PMOS transistor (PMOS) regions.

Figure 5:
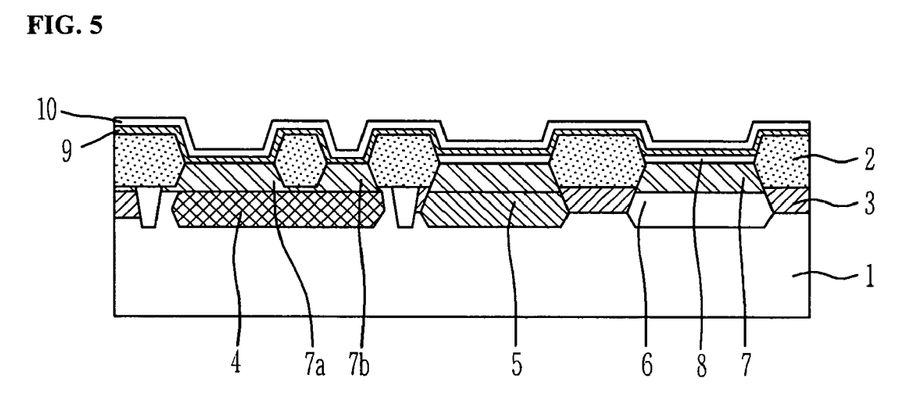

Referring to FIG. 5, an epitaxial layer 9 and a passivation oxide layer 10 are formed on the entire surface of the resultant structure, and then the epitaxial layer 9 formed on the isolation layer 2 is ion-implanted with high-concentration ions.

The epitaxial layer 9 to be used as the base of the HBT has a thickness of about 1200 Å. The epitaxial layer 9 can be formed of a buffer layer having a thickness of about 400 Å, a 20%-Ge mixed SiGe layer having a thickness of about 400 Å, and a cap layer having a thickness of about 400 Å. The buffer layer and the cap layer are undoped Si layers. Among them, a $P^+$ type layer substantially functioning as the base is a boron (B)-doped layer, and has a very small thickness in the SiGe layer and a very high concentration of about $5\times10^{19}/cm^3$. Therefore, the $P^+$ type layer maintains a withstanding voltage of the collector while enabling the high-speed operation.

The epitaxial layer 9 is formed by a reduced pressure chemical vapor deposition method, and uses gas such as $SiH_4$, $GeH_4$, $B_2H_6$, and $H_2$ at a pressure of several tens of torr and at a temperature of about 650 to 700° C. The passivation oxide layer 10 is formed by a low temperature oxidation (LTO) process at a temperature of 400° C. to have a thickness of 400 Å. The ion implantation is performed to reduce the resistance of an external base connection layer, and secure a stable resistance of the base having a high resistance.

Figure 6:
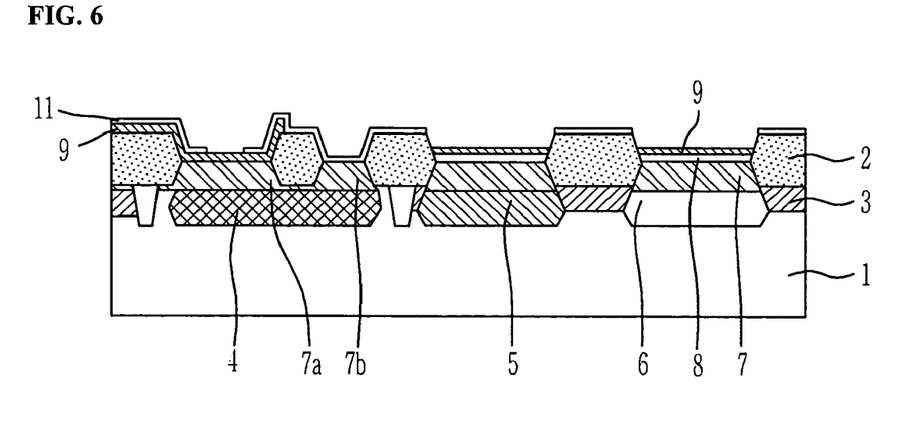

Referring to FIG. 6, the passivation oxide layer 10 is removed, and then the epitaxial layer 9 is patterned to remain only on the collector 7a, and the gate oxide layers 8 of the P-well region 5 and the N-well region 6. For interlayer insulation between the base and the emitter of the HBT, an oxide layer 11 is formed and patterned at the HBT region to expose the epitaxial layer 9 on the collector 7a to the external.

The oxide layer 11 is formed by the LTO process at a temperature of 400° C. to have a thickness of 800 Å.

Figure 7:
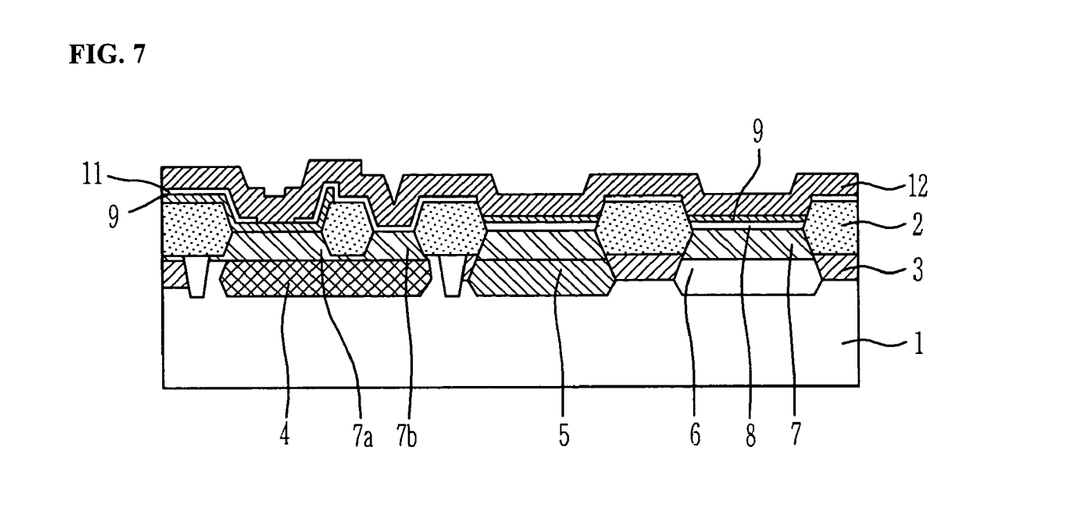

Referring to FIG. 7, a polysilicon layer 12 is formed on the entire surface of the resultant structure. The polysilicon layer 12 is formed by a low pressure chemical vapor deposition (LPCVD) process at a temperature of 625° C. to have a thickness of 2000 to 3500 Å.

Figure 8:
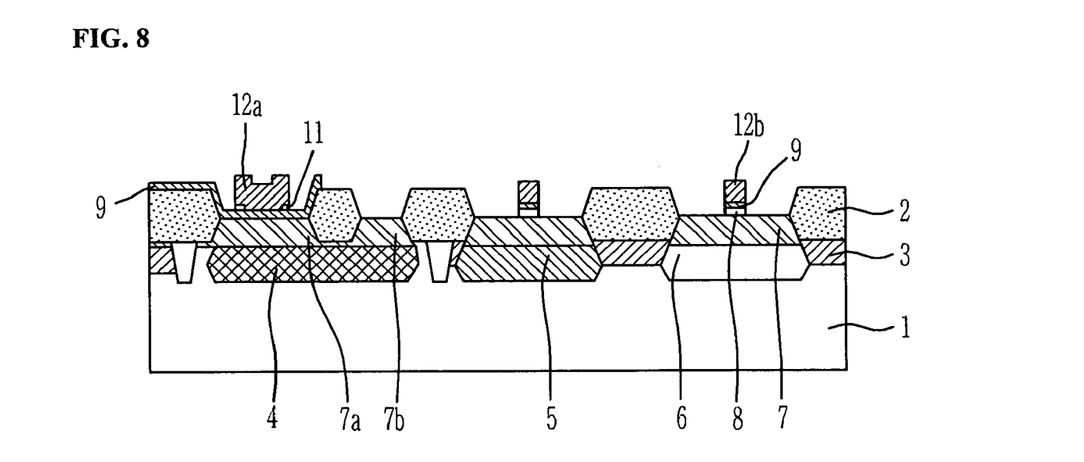

Referring to FIG. 8, the polysilicon layer 12 is patterned to form an emitter 12a of the HBT and gates 12b of the NMOS transistor (NMOS) and the PMOS transistor (PMOS), respectively. After that, the oxide layers 11 are removed at both sides of the emitter 12a of the HBT, and the exposed epitaxial layers 9 and gate oxide layers 8 are removed at both sides of the gates 12b of the NMOS transistor (NMOS) and the PMOS transistor (PMOS).

Figure 9:
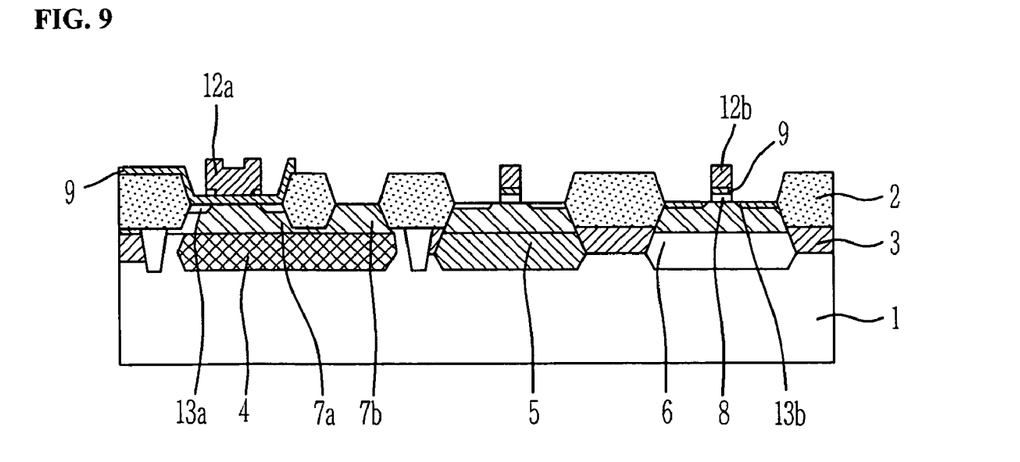

Referring to FIG. 9, the epitaxial layers 7 are ion-implanted at both sides of the gates 12b of the NMOS transistor (NMOS) and the PMOS transistor (PMOS) to form a lightly doped drain (LDD) region 13b, and the collector layers 7a are ion-implanted at both sides of the emitter 12a of the HBT to form a $P^+$ type external base layer 13a.

The LDD region 13b functions to improve an operating withstanding voltage of the CMOS device, and suppress generation of a hot carrier. The external base layer 13a prevents recombination and extinction of electrons injected from the emitter to the base, thereby increasing a current gain. When the LDD region 13b is N-type, it is ion-implanted with P-type ions having a concentration of $2.2\times10^{13}/cm^2$ at an energy of 60 KeV, and when the LDD region 13b is P-type, it is ion-implanted with $BF_2$ ions having a concentration of $9.0\times10^{12}/cm^2$ at an energy of 100 KeV. The external base layer 13a is ion-implanted with $BF_2$ ions having a concentration of about $4.0\times10^{14}/cm^2$ at an energy of 40 KeV.

Figure 10:
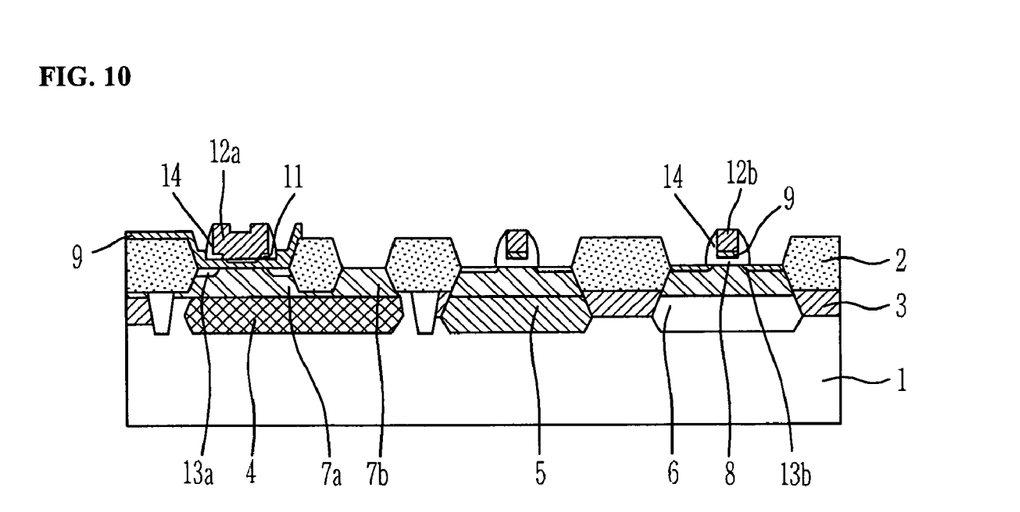

Referring to FIG. 10, spacers 14 are formed to a thicknesses of 2000 Å at both sidewalls of the emitter 12a of the HBT and at both sidewalls of the gates 12b of the NMOS transistor (NMOS) and the PMOS transistor (PMOS), respectively.

The spacer 14 is used in a conventional method for enhancing electrical insulation and breakdown voltage between an emitter and a base, or between a gate, a source and a drain. The spacer 14 can be easily embodied by forming an oxide layer using the LTO process, and then etching the oxide layer using an anisotropic process such as a reactive ion etching (RIE) process.

Figure 11:
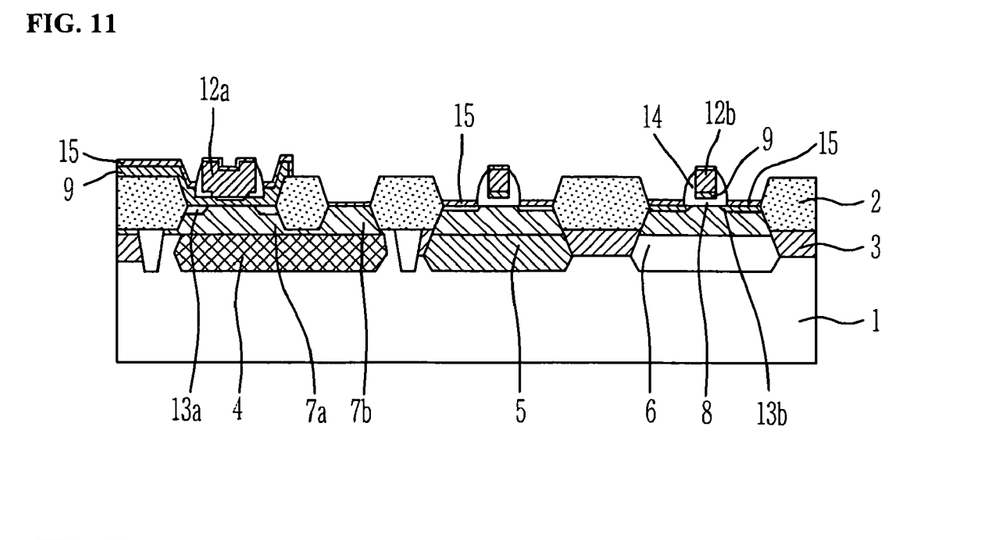

Referring to FIG. 11, an epitaxial layer 15 is formed using a selective epitaxial growth (SEG) process. The epitaxial layer 15 is grown only on the epitaxial layer 9, the emitter 12a, and the collector plug 7b of the HBT region, and on the gates 12b and the LDD regions 13b of the NMOS transistor (NMOS) and PMOS transistor (PMOS) regions, but is not grown on the oxide layer such as the isolation layer 2. At this time, the epitaxial layer 15 is grown on the epitaxial layer 9, and a polysilicon layer 15 is grown on the emitter 12a. The epitaxial layer 9 functioning as the external base connection layer can be increased in thickness by the epitaxial layer 15, thereby stabilizing a subsequential metal silicide process, and reducing an electrical resistance of the external base connection layer.

The epitaxial layer 15 is grown to a thickness of 1000 to 3000 Å, using gas such as $SiH_2Cl_2$, $GeH_4$, HCl, and $H_2$, at a pressure of several tens of torr and at a temperature of 650 to 700° C.

Figure 12:
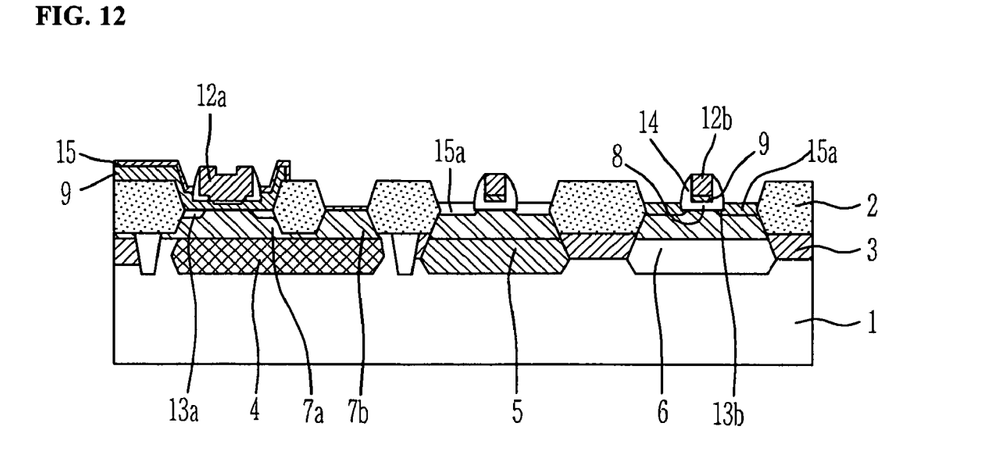

Referring to FIG. 12, the epitaxial layers 15 disposed at both sides of the gates 12b of the NMOS transistor (NMOS) and PMOS transistor (PMOS) regions are ion-implanted with high concentration ions to complete source and drain regions 15a. The NMOS transistor (NMOS) region is ion-implanted with P-type ions having a concentration of $8.0 \times 10^{15}/cm^2$ at an energy of 80 KeV, and the PMOS transistor (PMOS) region is ion-implanted with BF2 ions having a concentration of $3.7 \times 10^{15}/cm^2$ at an energy of 80 KeV.

Figure 13:
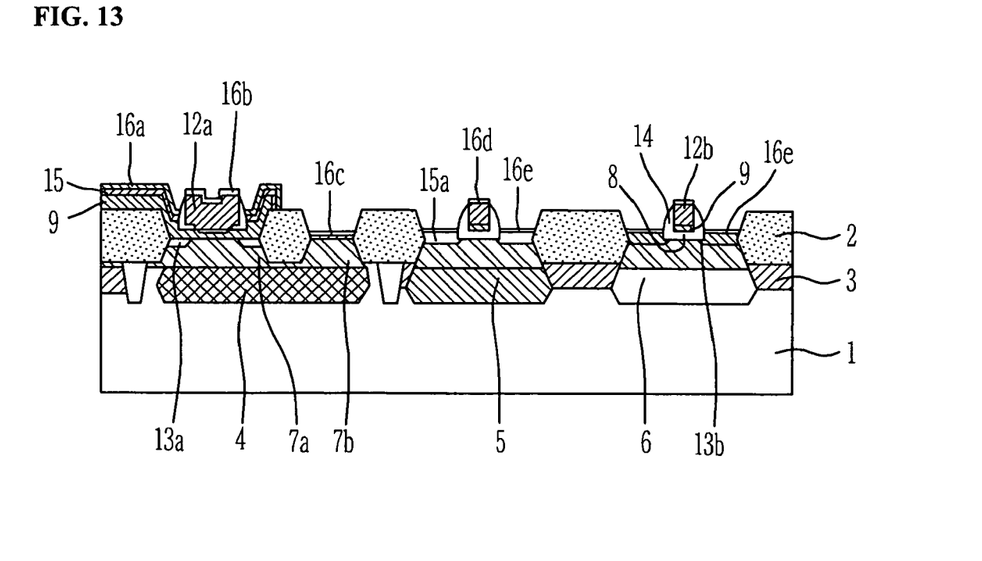

Referring to FIG. 13, a nickel (Ni) layer is deposited to a thickness of 500 to 1000 Å on the entire surface of the resultant structure using a sputtering process, and then the nickel (Ni) layer is heat treated at a temperature of less than 600° C. to form nickel silicide (NiGeSix) layers 16a, 16b, 16c, 16d and 16e on the epitaxial layer 15, the emitter 12a, and the collector plug 7b of the HBT, and the gates 12b and the source and drain regions 15a of the NMOS transistor (NMOS) and the PMOS transistor (PMOS). After that, the nickel (Ni) layer remaining without reaction is removed. The remaining nickel (Ni) layer is etched by a wet etching process using a one-to-one solution of $H_2SO_4$ and $H_2O_2$. At this time, the nickel (Ni) layer can remain on the source and drain regions 15a using a mask.

In another method, the nickel (Ni) layer is deposited to a thickness of 150 to 1000 Å on the entire surface of the resultant structure, using the sputtering process, and then a cap layer can be formed of TiN and heat treated at a temperature of less than 600° C., preferably 300 to 600° C., in order to prevent oxidation of the nickel (Ni) layer.

As described above, the silicide layers 16a, 16b, 16c, 16d and 16e are formed only on the epitaxial layer 15, not on a portion covered with the oxide layer, using a self aligned silicidation (salicide) process.

Figure 14:
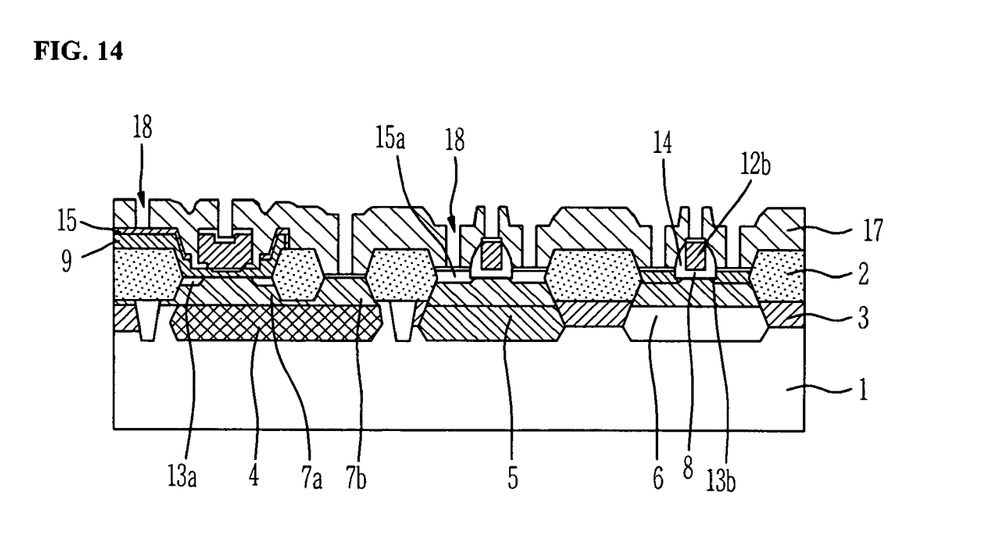

Referring to FIG. 14, an interlayer insulating layer 17 is formed on the entire surface of the resultant structure, and then contact holes 18 are formed in the interlayer insulating layer 17 to expose the silicide layers 16a, 16b and 16c of the HBT, and the silicide layers 16d and 16e of the NMOS transistor (NMOS) and the PMOS transistor (PMOS).

The interlayer insulating layer 17 is formed to a thickness of 6000 Å at a temperature of 400° C. using the LTO process.

Figure 15:
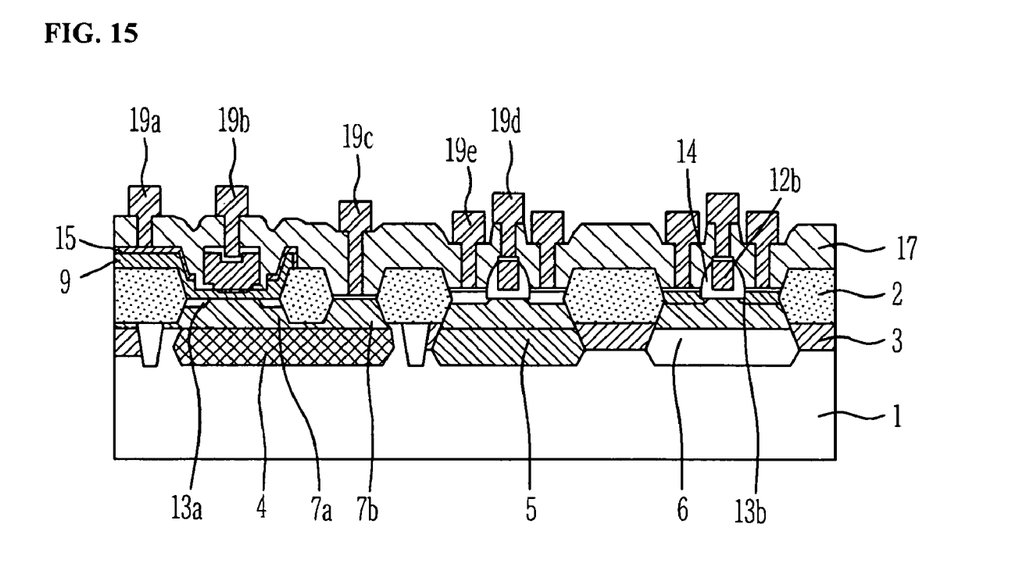

Referring to FIG. 15, a metal such as Ti/TiN/Al is deposited on the interlayer insulating layer 17 such that the contact holes 18 are buried. The metal is heat treated for thirty minutes at a temperature of 450° C. in an atmosphere of $N_2$ and $H_2$, and then patterned to form a base electrode 19a which is in contact with the epitaxial layer 15, an emitter electrode 19b which is in contact with the emitter layer 12a, a collector electrode 19c which is in contact with the collector plug 7a, a gate electrode 19d which is in contact with the gate 12b, and source and drain electrodes 19e which are in contact with the source and drain 15a, respectively.

A conventional method of forming a silicide layer using titanium (Ti) includes: the steps of removing an oxide layer remaining on NMOS transistor and PMOS transistor regions using a photolithography process and a dry etching; depositing a Ti/TiN layer and performing a primary heat-treating process on the Ti/TiN layer to form a high resistance titanium (Ti) silicide layer with a specific resistance of about 60 to 70 μΩcm on the emitter, the collector plug, the base, the gate, and the source and drain; etching the Ti/TiN layer remaining without reaction using a wet etching process; and performing a secondary heat-treating process and completing a low resistance titanium (Ti) silicide layer with a specific resistance of about 15 to 20 μΩcm.

However, the inventive method for forming the silicide layer using nickel (Ni) includes: the steps of depositing the nickel (Ni) layer using a sputtering method, and then heat-treating at a temperature of less than 600° C.; and removing the nickel (Ni) layer remaining without reaction.

In the conventional titanium (Ti) silicide layer, resistance abruptly increases as the linewidth decreases, but in the inventive nickel (Ni) silicide layer, the resistance stably increases in spite of the decrease of the linewidth. Accordingly, a nano-scale ultra high-speed, ultra low power device can be implemented.

In this embodiment of the present invention, the silicide layer 16a formed on the epitaxial layer 15 which functions as the external base layer of the HBT was measured to have a resistance of about 9 to 15 Ω/□, and the silicide layers 16d formed on the source and drain 15a of the NMOS transistor (NMOS) and the PMOS transistor (PMOS) were measured to have a resistance of 1.5 to 3 Ω/□. Table 1 shows the measurement results of sheet resistances (Rs) and external base resistances ($R_{EXR}$) of the titanium (Ti) silicide layer and the nickel (Ni) silicide layer.

TABLE 1

|  | Sheet resistance (Rs) [Ω/□] | External base resistance ($R_{EXR}$) [Ω/□] |
| --- | --- | --- |
| Ti silicide | 15.6 | 35 |
| Ni silicide | 1.5 | 9 |

Figure 16:
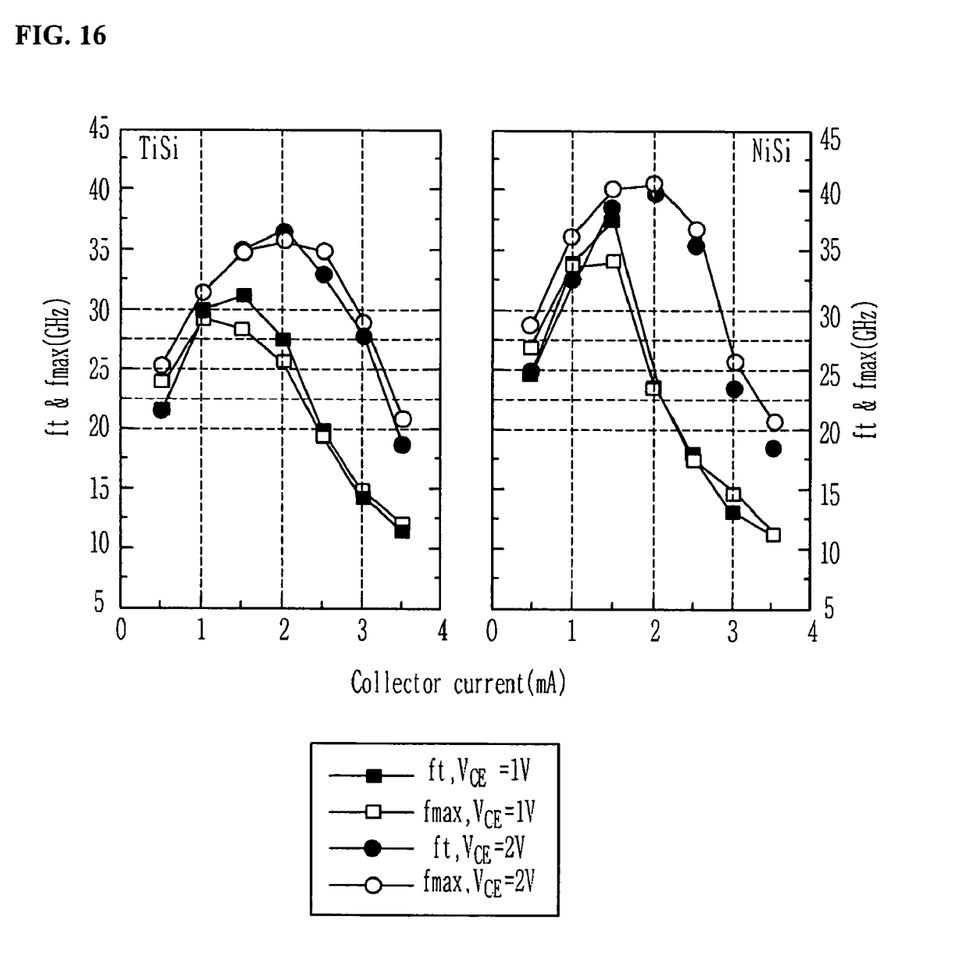
FIG. 16 is a graph illustrating an electrical characteristic of a nickel (Ni) silicide layer according to an exemplary embodiment of the present invention.

In a conventional art, the base resistance of the HBT is inversely proportional to the thickness of the silicide layer, and in the present invention, the epitaxial layer 15 functioning as the external base connection layer 13a is formed of a SiGe layer, which is grown using a selective epitaxial growth (SEG) method, thereby reducing the base resistance of the HBT more than in the conventional art, stabilizing the processes of forming the nickel silicide layer, and reducing the electrical resistance of the connection layer. Accordingly, if the inventive HBT is applied, the maximum oscillation frequency ($f_{max}$) being a radio frequency (RF) characteristic can be increased. FIG. 16 illustrates measurement results of $f_T$ and $f_{max}$, which are the radio frequency (RF) characteristics of the HBT using the titanium (Ti) silicide layer and the nickel (Ni) silicide layer. As appreciated from FIG. 16, when the present invention is applied, the base resistance ($R_B$) is decreased.

The present invention is the most suitable technology for fabricating a System on Chip (SoC) of radio frequency (RF)/analogue/digital for information communication, and can employ the nickel silicide process, thereby improving the RF characteristics ($f_T$ and $f_{max}$), and minimizing an abrupt increase of the contact resistance resulting from the decrease of the linewidth in the CMOS device. Accordingly, the HBT having the excellent RF and analogue characteristics can be integrated together with the CMOS transistor. In particular, according to the present invention, the source and drain of the CMOS device are formed using a silicon germanium (SiGe) heterojunction, instead of silicon, thereby preventing a leakage current resulting from a parasitic bipolar operation. Further, since the source and drain are connected with an external interconnection through the nickel (Ni) silicide layer, the contact resistance is reduced, thereby preventing loss of a necessary voltage for a device operation and accordingly, making it possible to enable a low voltage and low power operation and securing a broad operation region even in a low voltage operation of an analogue circuit.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. A method of fabricating a silicon germanium (SiGe) Bi-CMOS device having a heterojunction bipolar transistor and a CMOS (Complementary Metal Oxide Semiconductor) transistor, the method comprising the steps of:

forming a sub-collector region in a substrate of a bipolar transistor region, and forming well regions in the substrate of a CMOS transistor region, respectively;

growing silicon epitaxial layers on the substrate of the sub-collector region and the well regions;

forming a collector and a collector plug in the silicon epitaxial layers of the bipolar transistor region, respectively, and implanting ions for controlling a threshold voltage into the silicon epitaxial layers of the CMOS transistor region;

forming a gate oxide layer on the substrate of the CMOS transistor region, and forming a first epitaxial layer on the collector and the gate oxide layer;

forming an emitter on the first epitaxial layer of the collector, and forming a gate on the gate oxide layer;

implanting impurity ions into the first epitaxial layer at both sides of the gate to form a LDD (Lightly Doped Drain) region, and implanting impurity ions into the collector at both sides of the emitter to form an external base layer;

forming spacers at both sidewalls of the emitter and the gate, respectively, and forming a second epitaxial layer on the first epitaxial layer, the emitter, the collector plug, the gate, and the LDD region;

forming a source and a drain in the second epitaxial layer at both sides of the gate; and depositing and heat treating a nickel (Ni) layer on an entire surface of the resultant structure to form a nickel silicide layer on the second epitaxial layer, the emitter, the collector plug, the gate, and the source and drain, and removing the nickel (Ni) layer remaining without reaction.

2. The method as recited in claim 1, wherein the first epitaxial layer is formed of a buffer layer, a SiGe layer, and a cap layer, and the buffer layer and the cap layer are formed of an undoped silicon layer.

3. The method as recited in claim 1, wherein the second epitaxial layer is formed by a selective epitaxial growth (SEG) process.

4. The method as recited in claim 3, wherein the second epitaxial layer is grown using gases such as $SiH_2Cl_2$, $GeH_4$, HCl, and $H_2$, at a predetermined pressure and at a temperature of 650 to 700° C., to have a thickness of 1000 to 3000 Å.

5. The method as recited in claim 1, wherein the nickel (Ni) layer is deposited to a thickness of 500 to 1000 Å using a sputtering process.

6. The method as recited in claim 1, wherein the heat-treatment is performed at a temperature of 300 to 600° C.

7. The method as recited in claim 1, further comprising the step of, after the deposition of the nickel (Ni) layer, forming a cap layer on the nickel (Ni) layer in order to prevent oxidation of the nickel (Ni) layer.

8. The method as recited in claim 7, wherein the cap layer is formed of TiN.

9. The method as recited in claim 1, wherein the nickel (Ni) layer is removed by a wet etching process using a one-to-one solution of $H_2SO_4$ and $H_2O_2$.

10. The method as recited in claim 1, wherein in the step of removing the nickel (Ni) layer, the nickel (Ni) layer is not removed on the source and drain.

* * * * *